United States Patent [19]

Middelman et al.

[11] Patent Number: 5,496,613
[45] Date of Patent: Mar. 5, 1996

[54] PRINTED WIRE BOARDS AND METHOD OF MAKING SAME

[75] Inventors: Erik Middelman, Arnhem; Pieter H. Zuuring, LW Nijmegen, both of Netherlands

[73] Assignee: AMP-Akzo LinLim VOF, Arnhem, Netherlands

[21] Appl. No.: 157,038

[22] PCT Filed: May 19, 1992

[86] PCT No.: PCT/EP92/01132

§ 371 Date: Dec. 2, 1993

§ 102(e) Date: Dec. 2, 1993

[87] PCT Pub. No.: WO92/22191

PCT Pub. Date: Dec. 10, 1992

[30] Foreign Application Priority Data

Jun. 4, 1991 [NL] Netherlands .................. 9100957

[51] Int. Cl.$^6$ .................................................. B32B 9/00
[52] U.S. Cl. .................... 428/105; 428/113; 428/232; 428/288; 428/290; 428/209
[58] Field of Search ............................ 428/113, 232, 428/288, 290, 105

[56] References Cited

U.S. PATENT DOCUMENTS

| | | | |
|---|---|---|---|
| 1,660,924 | 2/1928 | Hopkinson | 428/113 |
| 3,686,048 | 8/1972 | Schirtzinger | 428/232 |
| 4,216,856 | 8/1980 | Moring et al. | 428/113 |
| 4,340,630 | 7/1982 | Doty | 428/113 |
| 4,368,234 | 1/1983 | Palmer et al. | 428/232 |
| 4,587,161 | 5/1986 | Barrell et al. | 428/288 |
| 4,622,254 | 11/1986 | Nishimura et al. | 428/113 |
| 4,678,821 | 7/1987 | Logullo, Sr. et al. | 428/288 |
| 4,759,147 | 7/1988 | Pirazzini | 428/113 |
| 4,775,583 | 10/1988 | Kawamura | 428/232 |
| 4,849,281 | 7/1989 | Brandon et al. | 428/288 |
| 4,943,334 | 7/1990 | Medney et al. | 156/174 |
| 4,980,217 | 12/1990 | Grundfest et al. | 428/113 |
| 5,039,566 | 8/1991 | Skubic et al. | 428/113 |
| 5,071,702 | 12/1991 | Matsuura et al. | 428/290 |
| 5,110,651 | 5/1992 | Massard et al. | 428/113 |
| 5,112,667 | 5/1992 | Li et al. | 428/113 |

FOREIGN PATENT DOCUMENTS

| | | | |
|---|---|---|---|
| 215392 | 3/1987 | European Pat. Off. | B29C 43/22 |
| 309982 | 4/1989 | European Pat. Off. | C08J 5/24 |
| 374319 | 6/1990 | European Pat. Off. | H05K 3/46 |
| 1229208 | 9/1960 | France. | |
| 283996 | 11/1989 | Japan | H05K 3/46 |

OTHER PUBLICATIONS

Printed Circuits Handbook, by C. F. Coombs, Jr., Chapters 31 (pp. 31.3 to 31.32), 32 (pp. 32.1–32.22), 33 (pp. 33.1 to 33.21), 34 (pp. 34.1 to 34.18) and Glossary (pp. 6.1 to 6.9).

*Primary Examiner*—Patrick J. Ryan
*Assistant Examiner*—Kam F. Lee
*Attorney, Agent, or Firm*—Richard P. Fennelly; Louis A. Morris

[57] ABSTRACT

A laminate, adapted to be used as a supporting board for a printed circuit, is disclosed which comprises layers of an electrically non-conductive matrix material reinforced with unidirectionally (UD) oriented fibers with the layers comprising individual matrix material having different directions of orientation. The layers are stacked to form a laminate of crossing layers, and the laminate has a core plane relative to which the crossing layers are in mirror image relationship so that the laminate has orthotropic properties. The laminate comprises layers of adhesive material present at least between any pair of layers of UD-reinforced matrix material having different directions of orientation.

16 Claims, No Drawings

PRINTED WIRE BOARDS AND METHOD OF MAKING SAME

BACKGROUND OF THE INVENTION

The invention relates to a base material for printed wire boards (PWBs) in the form of a laminate adapted to be used as a supporting board for a printed circuit and comprising layers of an electrically non-conductive matrix material reinforced with unidirectionally (UD) oriented fibres. The invention, also pertains to a method of manufacturing same.

DESCRIPTION OF THE PRIOR ART

Such base materials follow from the disclosure of U.S. Pat. No. 4 943 334, in which PWB substrates are described that are manufactured by a process which comprises winding reinforcing filaments about a square flat mandrel to form several layers of filaments intersecting at an angle of 90°. The materials so produced possess the advantage of having a low coefficient of expansion. A drawback that may occur is that of a relatively high interlaminar stresses due to the anisotropy of the reinforced layers. There is a danger of these stresses leading to delamination or to so-called transverse cracks being formed in the laminate. A further disadvantage resides in the high production costs.

A more simply producable laminate has been described in FR 1,229,208. This laminate comprises rigid composite layers alternating with adhesive layers. As the composite material cardboard impregnated with a phenolic resin is disclosed. The disclosed adhesive material is based on silicone rubber. The person of ordinary skill in the art will immediately appreciate that the laminate described is not in accordance with modern standards.

The current standard base materials for printed wire boards are generally manufactured according to the process described in, e.g., C. F. Coombs, Jr.'s *Printed Circuits Handbook* (McGraw-Hill), which includes the following steps:

Woven glass fibres are impregnated with a solution of epoxy resin in MEK.

Next, the solvent is evaporated and the resin partially cured up to a so-called B-stage.

The resulting prepreg is cut to length and stacked between two copper foils.

This package is cured under pressure at elevated temperature in a multidaylight press.

The laminate coated with copper on both sides manufactured in this manner is then formed into a printed wire board by etching.

Despite being the current standard, the material manufactured in this known manner displays several disadvantages, e.g.:

unequal and often too high thermal expansion in the laminate plane.

a high coefficient of expansion in the Z-direction.

high coarseness of the surface on account of the fabric structure.

high materials costs on account of the high costs of fabrics.

Moreover, the process is not environment friendly, since mostly harmful solvents, such as MEK and DMF, are employed. A further drawback to the process is the large number of generally labour-intensive process steps required.

It has been attempted to obviate the last-mentioned drawback by using a double belt press instead of multidaylight presses. Such a process is known, int. al., from EP-0215 392 B1. The advantages claimed for this known process are less product quality variation and lower production costs. Nevertheless, there are a number of drawbacks to this process also, such as unequal expansion in the X and Y directions and a low surface quality.

U.S. Pat. No. 4 587 161 discloses a production process for printed wire boards in which the substrate is composed of a mixture of epoxy resin and unsaturated polyester resin reinforced with glass fabrics or a randomly oriented glass fibre mat. Among the advantages attributed to this process are a lower cost price and a number of improved properties, including a lower dielectric constant. A drawback to this material, however, is that its thermal coefficient of expansion is significantly above the level presently desired by the electronics industry.

To meet the requirement of lower coefficients of expansion, substrates have been developed which are based on polymers with higher glass transition temperatures. In this way a reduction of the overall thermal expansion is attained over the temperature range from room temperature to soldering temperature, usually from 20°–280° C. An alternative approach to the problem of excessive thermal expansion consists in the replacement of E-glass with a reinforcing material having a lower coefficient of expansion, such as S-glass, D-glass, quartz, silica, and, int. al., aramids, such as Twaron®. The principal disadvantage of the two approaches resides in the high cost price of such raw materials.

In EP 374 319 a PWB is disclosed comprising a crossplied structure of aramid tape embedded in a matrix material. The structure is formed by precuring tape-reinforced UD layers to the so-called B-stage, crosswise stacking the layers, laminating them together with copper foil, and then curing the entire stack. A drawback to the use of aramid tape is the high thermal coefficient of expansion (TCE) over the thickness of the laminate. The disclosed technology of stacking B-staged prepregs is disadvantageous for use with UD fibres, as the prepreg will flow under pressure, which will lead to desorientation of fibres upon lamination. The resulting laminates then substantially display an undesired lack of flatness (bow warp twist).

In EP 309 982 a base material suitable for PWBs is manufactured from stacks of crosswise applied prepregs bonded by hardening, the prepregs comprising UD oriented crystalline ceramic fibres. The drawback of using B-stage materials mentioned above applies. Further the disclosed materials are relatively expensive and require the use of expensive diamond tools for drilling holes.

SUMMARY OF THE INVENTION

The invention has for its object to provide a base material for PWBs that does not have the aforementioned drawbacks of the prior art base materials. Moreover, it is an object of the invention to provide a base material which has the advantage of a low thermal coefficient of expansion, combined with relatively low production costs. A further object of the invention is to provide a base material as mentioned in which the interlaminar stresses are sufficiently low so as to avoid substantial delamination or transverse cracks.

To this end, the invention consists therein that in a laminate of the known type mentioned in the opening paragraph layers of adhesive material are present at least between each pair of layers of UD-reinforced matrix material having different directions of orientation.

As stated above, the laminate of the invention is adapted to be used as a base material for PWBs. This generally means that it can serve as a flat substrate, the surface of which either is provided with conductive material, such as copper foil, or is made suitably catalytic for electroless metal deposition. The material can be used for both single-sided and double-sided printed wire boards, but is especially suitable for use in multilayered printed wire boards, also known as multilayers. Further, in order to be the most serviceable as a base material for PWBs, the laminate of the invention will be adapted so as to be orthotropic.

DESCRIPTION OF PREFERRED EMBODIMENTS OF THE INVENTION

Here follows a description of various embodiments of the invention.

Any suitable fibre or filamentary material may be used as the reinforcement in the layers of composite material. Examples thereof include A-glass, AR-glass, C-glass, D-glass, E-glass, R-glass, S1-glass, S2-glass, and other appropriate types of glass, silica, quartz, and polymers, such as polyethylene terephthalate (PETP), polyethylene 2,6 naftalene dicarboxylate (PEN), liquid crystalline polymers, such as paraphenylene terephthalamide (PPDT), poly benzthiazole (PBT), poly benzoxazole (PBO), poly benzimidazole (PBI), and ceramic fibre materials, such as alumina and silicon carbide. Preferred are E-glass, D-glass, R-glass and Twaron® or Kevlar® aramid fibre.

Suitable matrix materials include thermosetting materials based on epoxide resin (EP), unsaturated polyester resin (UP), polyurethane (PU), vinyl ester resin (VE), polyimide (PI), bis-citraconic imide (BCI), bis-maleimide (BMI), cyanate esters, polybutylene, silicones, BMI-trizazine-epoxy resins, triazines, acrylates, and phenol resins, and thermoplastic materials, such as polyphenylene oxide (PPO), polyether sulfone (PES), polysulfone (PSU), polyarylate (PAR), polyether imide (PEI), polyether ether ketone (PEEK), polyether ketone (PEK), polyamide imide (PAI), polyphenylene sulfide (PPSU), poly tetrafluoro ethylene (PTFE), tetrafluoro-ethylene-hexafluoro propylene copolymer (FEP) and other polymers resistant to elevated temperatures, such as high aromatic polyesters, thermoplastic aramids, and PI, and blends of the above-mentioned polymers. It is advantageous to incorporate compounds lending flame retardancy to the matrix material, such as phosphorus or halogen (notably bromine) containing compounds. bisphenol-A. The preferred matrix materials are epoxy resins, mixtures of epoxy resin and unsaturated polyester, and cyanate esters. Preferred epoxy resins are bisphenol-A epoxy resins, phenol novolac resins, cresol novolac resins, and mixtures thereof, preferably also incorporating tetrabromo bisphenol-A for flame retardancy.

Further, it has been found advantageous to use a fast-curing resin system as the matrix material, more specifically a resin system not substantially displaying storage stability at room temperature. Fast-curing resin systems are known to the person of ordinary skill in the art and find usage, for example, with pultrusion. A preferred example of such a system is a mixture of a diglycidyl ether of bisphenol-A having an epoxy equivalent weight (EEW) of about 190, a diglycidyl ether of tetrabromo bisphenol-A having an EEW of about 400, and an alicyclic diamine.

The matrix may comprise additives, many of which are customary, such as: catalysts (including catalysts to promote the growth of conductive material), fillers, such as quartz powder to reduce thermal expansion, inhibitors, flame retardants, such as halogen compounds, and other additives capable of exerting a positive effect on the substrate and during processing. The matrix may further be made catalytic for electroless copper deposition, e.g., by including noble metals or noble metal compounds, notably Palladium.

The fibre content in matrix generally is about 10–90 vol % and preferably from about 40 to about 70 vol %. Most satisfactory is a fibre volume fraction of approximately 50 vol %.

The adhesive material comprised in the layers between the UD-reinforced layers of different directions of orientation may be the same or different as the matrix material. So, the material of the adhesive layer is preferably selected from the following group of materials:

thermosetting materials, such as EP, UP, PU, VE, PI, BCI, BMI, cyanate esters, polybutylene, silicones, BT-epoxy resins, triazines, acrylates, and phenol resins, and thermoplastic materials, such as PPO, PES, PSU, PAR, PEI, PEEK, PEK, PEKK, PPO, PAI, PPSU, PTFE, FEP, PFA, and other polymers resistant to elevated temperatures, such as high aromatic polymers, thermoplastic aramids, and PI, and blends of the above-mentioned polymers.

Although, due to their different thermal history, the adhesive layers will generally be analytically identifiable as separate layers, it has been found that superior adhesion is achieved if the adhesive material is similar to the matrix material. The adhesive preferred in conjunction with the preferred fast curing epoxy resin disclosed above is a mixture of similar ingredients, with phenol novolac as an additional component.

The adhesive layer may also contain additives, such as catalysts, fillers, inhibitors, thixotropic agents, and adhesion promotors.

A preferred laminate having an advantageously low thermal coefficient of expansion (TCE) is obtainable by fast curing the stacked structure of non-flowing UD-reinforced layers and adhesive layers under a low pressure. More specifically, the laminate so obtainable displays a TCE of about 8 ppm/°C. in the X and Y directions and about 16 ppm/°C. in the Z direction. This is particularly advantageous if multichip modules are to be prepared from the laminate.

The UD-reinforced layers contained in the laminate of the invention generally have a thickness in the range of 6 to 800 μm, preferably about 15 to 400 μm. The thickness of the adhesive layer is generally in the range of 0,5 to 500 μm, preferably of about 1 to 50 μm. The most satisfacory adhesive layers have a thickness of approximately 5 μm.

The laminate of the invention preferably is a symmetric, orthotropic, balanced cross-ply laminate. More preferably, the UD-reinforced layers are stacked so as to have any one of the following structures (0° and 90° indicating orthogonal directions of orientation and (-) indicating an adhesive layer):

0°-90°-0°;

0°-90°-90°-0°;

0°-90°-0°-90°-0°;

0°-90°-90°-0°-0°-90°-90°-0°.

It should be noted that in order for the 0°-90°-0° laminate to be balanced the thickness of the single 90° layer should be twice that of the 0° layers.

As stated above, one of the advantages of the laminates of the invention is their relatively simple and cheap production process. In this respect the invention also pertains to a method of manufacturing such a laminate, comprising the following steps:

manufacturing an electrically non-conductive synthetic layer reinforced with unidirectionally oriented fibres, which will not be made to flow during the subsequent steps;

single-sided or double-sided coating of at least part of the aforementioned unidirectional laminate with an adhesive;

stacking the at any rate partially adhesive-coated laminates in such a way that there is at least one layer of adhesive between each pair of layers and practically the same amount of material of even thickness and composition is disposed in the virtually perpendicularly intersecting orientation directions;

bonding the stacked UD laminates by activating (curing) the adhesive layers.

Advantages of the method according to the invention over existing techniques include the following:

The material according to the process can be substantially more inexpensive than substrates based on fabrics.

The material according to the process will have a low thermal coefficient of expansion, which will be the same in all directions of the plane.

The interlaminar stresses in the material according to the process will be lower than in materials in which the crossing layers are formed in a single process pass.

Well-defined thickness of the dielectric material.

Low surface coarseness.

Essential to the method of the invention is that first a unidirectional fibre-reinforced resin layer is produced. The preparation of UD-reinforced layers is known in itself to the person of ordinary skill in the art and does not require detailed explanation here.

A preferred way of forming the UD-reinforced layer involves impregnating a reinforcing fibre layer with synthetic resin as it unwinds from a creel and consolidating it, preferably continuously. When a thermosetting matrix is employed, such consolidating is by means of the synthetic resin being cured, preferably at elevated temperature, or, say, under the influence of UV light or with the use of microwaves. When use is made of a thermoplastic matrix, consolidation is by means of cooling the synthetic material: to below the melting point in the case of semi-crystalline polymers being used, to below the glass transition temperature for amorphous synthetic materials being used. The resulting material in this form is not yet suitable for use as a substrate for printed wire boards, since the transverse strength, i.e. the strength perpendicular to the fibre direction, is very low and there is a substantial difference in thermal coefficient of expansion between the material in the fibre direction and that in the direction perpendicular thereto.

To make further processing of the UD laminate possible, part of the material should be provided with an adhesive layer, which can be applied immediately after consolidation of the material. Alternatively, the adhesive layer can be provided discontinuously after the UD laminate has been cut or wound, and on one side as well as two; it can even be omitted entirely for part of the UD laminate. Various materials can be employed as adhesive layer, with EP, PU, and acrylate being preferred. Since several types of adhesives are tacky also at room temperature, objectionable sticking of the UD laminates in such cases is avoided by separating the laminates with a separating foil or a special release paper.

The adhesive layer can be applied either from solution or solventless, e.g., in the liquid state or by means of a transfer in the form of a film or through a hot melt process. It may be advantageous to pre-cure the adhesive layer up to the so-called B-stage prior to further process steps.

The UD laminates provided with an adhesive layer can then be stacked, optionally together with UD laminates not provided with an adhesive layer and, also optionally, together with a copper foil provided with an adhesive layer or not, to form a desired laminate structure. In this stacking process it should be taken into account that the UD laminates stacked to form a single laminate of crossing layers must be in mirror image relationship relative to the plane of symmetry of the core plane, so as to obtain orthotropic properties. If this is not the case, the formed laminate of crossing layers will warp on account of internal stresses.

The adhesive can be applied either on one or on both surfaces of the UD-reinforced layer, as long as UD-reinforced layers having different directions of orientation are alternated with at least one adhesive layer.

Together with layers of copper foil, though optionally without them, the package of crosswise stacked UD laminates is then introduced into a press, after which a laminate of crossing layers is formed under the influence of heat and pressure. If a thermosetting matrix is employed in the UD laminates, the temperature during the forming of the laminate of crossing layers should be above the activating temperature of the adhesive layer but below the degradation temperature of the thermosetting matrix used. In the case of a thermoplastic matrix being used in the UD laminates, the processing temperature should be above the adhesive's activating temperature but below the glass transition temperature and the melting temperature, respectively, of the used amorphous thermoplast or semi-crystalline thermoplast.

Although UD laminates are preferably bonded in a multidaylight press, other types of presses, such as the double belt press, are also suitable for such a use. When use is made of a double belt press, one or more layers of UD laminate are unwound, preferably in the production direction, and combined upstream of the double belt press's inlet with layers of UD laminate which are so disposed that the principal fibre direction is at an angle of 90° to the production direction, such that these 90° laminates form a virtually continuous strip. Furthermore, the construction is such that between each pair of layers to be combined there is provided at least one layer of adhesive. As they pass through the double belt press the adhesive layers are activated or cured by the increase in temperature. In addition to platen press or multidaylight press processing or double belt press processing, it is possible to manufacture laminates of crossing layers in an autoclave, a vacuum bag, a press-clave, a multidaylight press-clave, a combination of two or more of the foregoing, or in any other suitable apparatus.

The following applies to further embodiments of the method according to the invention:

Where a solvent-based resin (a resin solution) is used to impregnate the UD-reinforced layers, the method of the invention advantageously allows for "on-line" evaporation of said solvent (i.e. without further process steps). The impregnation itself is also advantageously carried through "on-line", particularly using a hot melt resin not containing a solvent. In another embodiment, impregnation (from a solution or using a hot melt) is carried through off-line, if appropriate including driving off the solvent, and possibly a pre-cure.

The reinforcement fibres may advantageously be cleaned directly prior to impregnation, using, e.g., a heat-cleaning method. If desired, an adhesive or adhesion promotor can be applied after cleaning and prior to impregnation, all steps preferably being conducted "on-line".

In addition to rendering the matrix material suitable for additive plating (such as electroless copper plating), a coating catalyzed for additive plating can be applied to the laminate. Such coatings, usually rubber-modified, are known to the person of ordinary skill in the art, and are generally referred to as "additive adhesives" (although it is a primer promoting adhesion, of grown copper rather than a glue). An important advantage of the method of the invention is that it allows "on-line" application of the additive adhesive, preferably substantially simultaneously with stacking the UD-reinforced layers. For examples of additive adhesives reference can be made, e.g., to the afore-mentioned Printed Circuits Handbook, chapter 13.

In order to bond an electrically conductive layer to one or both of the outer surfaces of the laminate, one or both of these surfaces may be provided with an adhesive layer, usually of a thickness in the range of 2 to 70 μm, preferably approximately 20 or 35 μm (two types being commonly used, viz. 0.5 or 1 ounce per square inch). It is also possible to provide a laminate having an electrically conductive layer on one outer surface thereof and an adhesive layer on the other.

The laminates according to the invention are highly suitable as supporting boards for printed circuits. More particularly, the laminates can be advantageously used in multilayer PWBs. The laminates are also suitable for use as a flexible board or laminate, and in rigid-flex laminates. Preferably, the orientation of the outer UD-reinforced layer in such a flexible board (or the flexible part of a rigid-flex laminate) is parallel to the desired bending direction.

The invention further allows for relatively cheap preparation of thin-core PWBs. These are normally prepared from substrates reinforced with thin fabrics. For example, 100 μm thin core substrate is usually prepared from a resin reinforced with two layers of Style 108 woven glass fabric with a surface weight of 1,4 ounce/square yard. Thin fabrics like Style 108 are woven from 5,5 tex glass yarn, which is typically up to about 20 times as expensive as a 136 tex roving. According to the invention thin-core laminate are obtainable from such a relatively cheap 136 tex roving. In this respect it should be noted that fiber-reinforced PWB substrates can be discriminated on the basis of a thickness factor (T-factor), T being defined as the ratio of the thickness of the substrate in μm and the average titer of the yarn used (in tex). The invention provides for laminates having a T-factor of less than 5,5. This advantage is associated with the method described hereinbefore, as a high extent of filament spreading is attained by virtue of the fact that initially UD-reinforced layers are formed, the spreading being retained by virtue of the at least partial cure of the UD-reinforced layers.

A convential board reinforced with 2 layers of Style 108 glass fabric has a T-factor of (100/5.5)=18.8 μm/tex. Boards according to the invention could be prepared with T-factors exemplified as follows:

A 100 μm laminate reinforced with 3 UD-layers (0°-90°-0°) of 136 tex E-glass has a T-factor of (100/136)=0.73 μm/tex.

A 200 μm laminate comprising two UD-reinforced layers of 50 μm (reinforcement 136 tex E-glass) and one UD-reinforced layer of 100 μm (reinforcement 300 tex E-glass). The average titer being 218 tex, the T-factor is 200/218=0.92 μm/tex.

An 800 μm laminate comprising 3 UD-reinforced layers (0°:200 μm- 90°:400 μm-0°:200 μm) the reinforcement being 300 tex E-glass has a factor T of 800/300=2.7 μm/tex.

The invention will be further illustrated with reference to the following unlimitative example.

EXAMPLE

A base material for printed wire boards in accordance with the present invention, and particularly suitable for use in a multilayer board is prepared as follows:

From a creel continuous strands of E-glass, type EC-11-136-1383, are fed to a spreading device in order to form a thin flat sheet of unidirectional (UD) E-glass filaments. This sheet of parallel-oriented filaments is transported t an impregnator, where the strands are impregnated with a resin mixture consisting of about 100 parts by weight of Epikote 828 EL
about 73 parts by weight of Epikote 5050
about 30 parts by weight Isophorane diamine.

The sheet consists of 300 E-glass strands and has a width of 630 mm.

The impregnated filament sheet is then fed together with a copper foil of 20 μm thickness to a continuous belt press where the resin is cured at a temperature of 200° C. and a pressure of 2 Bar.

The UD-fibre-reinforced resin sheet has a thickness of 50 μm and a fibre volume fraction of 0,5 when leaving this continuous belt press. The sheet is subsequently coating an one side with an epoxy-adhesive consisting of:

Epikote 828 EL
Epikote 155
Epokote 5050
Boriumtrifluoride-monoethyl amine complex.

The thickness of this adhesive is 5 μm. The adhesive film is precured to increase the tg to Tg>30° C.

The continuous copper-clad and adhesive-coated sheet is cat to squares having a size of 630×630 mm and stored until further use.

Using the same process and materials, with the exception of the copper foil, a UD-fibre-reinforced resin sheet having a thickness of 100 μm is manufactured using 600 EC-11-136-1383 glass strands.

This continuous sheet is cut to a size of 630×630 mm.

The copper-clad UD-layers (x) with a thickness of 50 μm are stacked with an uncald UD-lauer (Y) with a thickness of 100 μm in the following order: x-y-x, with the fibre direction of the Y-layer being oriented at an angle of 90° with respect to the fibres in the x-layers.

The stack is placed in an heated platen press and the adhesive layers are cured at a themperature of 180° C. and a pressure of 15 Bar.

After the laminate has been cooled in the press, it can be cut to the desired size, after which it is ready for further processing into multilayer boards.

We claim:

1. A laminate, adapted to be used as a supporting board for a printed circuit, comprising layers of an electrically non-conductive matrix material reinforced with unidirectionally (UD) oriented fibers which layers comprise individual matrix material having different directions of orientation and the layers being stacked to form a laminate of crossing layers, the laminate having a core plane relative to which the crossing layers are in mirror image relationship so as to obtain orthotropic properties for the laminate and comprising layers of adhesive material present at least between any pair of layers of UD-reinforced matrix material having different directions of orientation.

2. A laminate according to claim 1, wherein UD-reinforced layers of any orthogonal directions of orientation 0° and 90° are stacked so as to have a structure selected from the group consisting of:

0°-90°-0°;

0°-90°-90°-0°;

0°-90°-0°-90°-0°; and

0°-90°-90°-0°-0°-90°-90°-0°.

3. A laminate according to claim 1 wherein the matrix material is an epoxy resin and the reinforcement fibers are E-glass fibers.

4. A laminate according to claim 1 wherein the adhesive material is an epoxy resin.

5. A laminate according to claim 1 wherein the UD-reinforced layers have a thickness in the range of 15 to 400 µm, and the adhesive layers have a thickness in the range of 1 to 50 µm.

6. A laminate as claimed in claim 1 wherein the matrix material is catalytically active for additive plating.

7. A laminate as claimed in claim 2 wherein the matrix material is catalytically active for additive plating.

8. A laminate as claimed in claim 7 wherein the matrix material and adhesive are epoxy resin.

9. A laminate according to claim 6 wherein on at least one surface it comprises a rubber-modified coating layer which is catalytically active for additive plating.

10. A laminate having a thickness of x µm which is adapted to be used as a supporting board for a printed circuit and which comprises layers of an electrically non-conductive matrix material reinforced with unidirectionally (UD) oriented fibers having a titer of y tex wherein the laminate has a thickness factor (T=x/y) of below 5.5 µm/tex.

11. A copper-clad material comprising a substrate sandwiched between two layers of copper foil wherein the substrate is a laminate according to any one of the claims 1–10.

12. A material suitable to form a supportive bonding layer in between circuitized boards in a multilayer printed wire board construction, comprising a substrate having an adhesive coating on the outer surface thereof, wherein the substrate is a laminate according to any one of the claims 1–10.

13. A method of manufacturing a base material for printed wire boards comprising the following steps:

manufacturing an electrically non-conductive synthetic layer reinforced with unidirectionally (UD) oriented fibers, which will not be made to flow during the subsequent steps;

single-sided or double-sided coating of at least part of the aforementioned unidirectional layer with an adhesive;

stacking the at least partially adhesive-coated layers in such a way that there is at least one layer of adhesive between each pair of UD-reinforced layers having a different direction of orientation and practically the same amount of material of even thickness and composition is disposed in the virtually perpendicularly intersecting orientation directions; and bonding the stacked UD laminates by activating the adhesive layers.

14. A method according to claim 13 wherein the bonding of the stacked UD-reinforced layers is conducted substantially simultaneously with the laminating of an electrically conductive layer on at least one outer surface of the stacked laminate of crossing layers.

15. A method according to claim 13 wherein a coating catalyzed for additive plating is laminated with the UD-reinforced layers.

16. A method according to claim 15 wherein the coating is applied substantially simultaneously with stacking the UD-reinforced layers.

* * * * *

UNITED STATES PATENT AND TRADEMARK OFFICE
CERTIFICATE OF CORRECTION

PATENT NO. : 5,496,613
DATED : March 5, 1996
INVENTOR(S) : Erik Middelman, Pieter Hendrik Zuuring It is certified that error appears in the above—identified patent and that said Letters Patent is hereby corrected as shown below:

On the Title page, item [75] Inventors, "LW" before "Nijmegen" should be deleted;
On the Title page, item [73] Assignee, "Lin Lim" should be --Lim Lam--;

Col. 8, line 10, "t" should be --to--;

Col. 8, line 24, "coating an" should be --coated on--;

Col. 8, line 31, "tg" should be --Tg--; and

Col. 8, line 33, "cat" should be --cut--.

Signed and Sealed this

First Day of October, 1996

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO. : 5,496,613
DATED : March 5, 1996
INVENTOR(S) : Erik Middelman, Pieter Hendrik Zuuring It is certified that error appears in the above—identified patent and that said Letters Patent is hereby corrected as shown below:

On the title page: Item [73] Assignee

"AMP-Akzo LinLim VOF" as the name assignee should read,

--AMP-Akzo LinLam VOF--.

Signed and Sealed this

Tenth Day of December, 1996

Attest:

BRUCE LEHMAN

Attesting Officer     Commissioner of Patents and Trademarks